United States Patent
Takahara

(10) Patent No.: US 8,289,715 B2
(45) Date of Patent: Oct. 16, 2012

(54) PLASMA DISPLAY DEVICE

(75) Inventor: Ichiro Takahara, Osaka (JP)

(73) Assignee: Panasonic Corporation, Osaka (JP)

( * ) Notice: Subject to any disclaimer, the term of this patent is extended or adjusted under 35 U.S.C. 154(b) by 163 days.

(21) Appl. No.: 12/869,334

(22) Filed: Aug. 26, 2010

(65) Prior Publication Data

US 2011/0051369 A1 Mar. 3, 2011

(30) Foreign Application Priority Data

Aug. 31, 2009 (JP) .................................. 2009-199429
Aug. 31, 2009 (JP) .................................. 2009-199430

(51) Int. Cl.
*H05K 7/20* (2006.01)

(52) U.S. Cl. ................. 361/721; 361/679.5; 361/679.51; 349/58; 348/836

(58) Field of Classification Search .......... 361/679.48–679.51, 690–692, 361/695, 709, 717–721, 736, 748
See application file for complete search history.

(56) References Cited

U.S. PATENT DOCUMENTS

| | | | |
|---|---|---|---|
| 7,133,281 B2 * | 11/2006 | Bae ........................... | 361/679.21 |
| 7,349,205 B2 * | 3/2008 | Hall et al. ................. | 361/679.33 |
| 7,561,426 B2 | 7/2009 | Jeong | |
| 8,035,968 B2 * | 10/2011 | Kwon et al. ................. | 361/695 |
| 2003/0128503 A1 * | 7/2003 | Takahashi ..................... | 361/681 |
| 2004/0036819 A1 * | 2/2004 | Ryu et al. .................... | 349/58 |
| 2004/0174675 A1 * | 9/2004 | Liu ............................. | 361/687 |
| 2004/0264130 A1 * | 12/2004 | Liang .......................... | 361/690 |
| 2005/0105012 A1 * | 5/2005 | Kim et al. .................... | 349/58 |
| 2005/0117304 A1 * | 6/2005 | Kim ............................ | 361/704 |
| 2006/0070280 A1 * | 4/2006 | Yamamura et al. ............ | 40/564 |
| 2008/0083527 A1 | 4/2008 | Horng et al. | |

FOREIGN PATENT DOCUMENTS

| | | |
|---|---|---|
| JP | 60-033744 | 2/1985 |
| JP | 8-069254 | 3/1996 |
| JP | 9-199066 | 7/1997 |
| JP | 2001-282114 | 10/2001 |
| JP | 2003-162228 | 6/2003 |
| JP | 2006-058679 | 3/2006 |
| JP | 2006-293349 | 10/2006 |
| JP | 2007-140096 | 6/2007 |

* cited by examiner

*Primary Examiner* — Courtney Smith
(74) *Attorney, Agent, or Firm* — Hamre, Schumann, Mueller & Larson, P.C.

(57) ABSTRACT

A plasma display device is provided with a chassis supporting a PDP on its front surface, circuit boards located within a specific region of the back surface of the chassis, a back cover including an edge portion covering the outside of the specific region of the back surface of the chassis and a projecting portion accommodating the plurality of the circuit boards, and a fan arranged inside a space defined by the projecting portion. The peripheral wall of the projecting portion is provided with a plurality of air inlets and a plurality of air outlets.

11 Claims, 7 Drawing Sheets

PRIOR ART

PLASMA DISPLAY DEVICE

BACKGROUND OF THE INVENTION

1. Field of the Invention

The present invention relates to a plasma display device that uses a plasma display panel as a display device.

2. Description of Related Art

In recent years, thin display devices have spread rapidly. Such thin display devices are expected to spread more and more in the future and to replace conventional CRTs. Currently, thin display devices usually are placed on the floor as are conventional CRTs. However, in the future, wall-mounted or near-wall installation will become mainstream to take more advantage of the space saving features of the thin display devices.

Meanwhile, in some conventional plasma display devices, as one of the thin display devices, an air inlet and air outlet are provided on a back cover, and internal heat is emitted to the outside by forced convection (ventilation) using a fan. Further, others emit internal heat to the outside by natural convection (ventilation) without a fan.

For example, JP 2003-162228 A discloses a plasma display device 101 as indicated in FIG. 7. In the plasma display device 101, a plasma display panel 102 (hereinafter, abbreviated as "PDP"), a chassis 103 supporting the PDP 102 on its front surface, and a plurality of circuit boards 120 mounted to the back surface of the chassis 103 via bosses are accommodated in a housing constituted by a front cover 108 and a back cover 107. Further, a heat conductive sheet 104 is interposed between the PDP 102 and the chassis 103.

Furthermore, an air inlet 111 is provided in the lower part of the back cover 107 and an air outlet 110 is provided in the upper part thereof. A fan 109 is provided inside the back cover 107 so as to cover the air outlet 110. When the fan 109 is operated, external air is drawn into the back cover 107 through the air inlet 111 as indicated by the arrow a in the figure, while the air inside the back cover 107 is emitted to the outside through the air outlet 110 as indicated by the arrow b in the figure. Thus, the chassis 103 and the circuit boards 120 are cooled by forced convection, and the heat transferred from the PDP 102 through the chassis 103 and the heat in the circuit boards 120 are emitted to the outside.

However, the configuration indicated in FIG. 7 does not allow the internal heat to be emitted sufficiently when the plasma display device 101 is mounted on the wall or placed near the wall, because the airflow into the air inlet 111 and the airflow from the air outlet 110 are hampered by the wall surface being close to or in contact with the back cover 107.

SUMMARY OF THE INVENTION

In view of such circumstances, it is an object of the present invention to provide a plasma display device capable of emitting internal heat sufficiently, even when being mounted on the wall or placed near the wall.

In order to solve the conventional problems mentioned above, the plasma display device of the present invention is provided with a PDP, a chassis supporting the PDP on its front surface, circuit boards located within a specific region of the back surface of the chassis, a back cover including an edge portion that covers the outside of the specific region of the back surface of the chassis and a projecting portion that projects inside the edge portion toward the side opposite to the chassis and that accommodates the circuit boards, and a fan arranged inside the space defined by the projecting portion. In the plasma display device, the projecting portion includes a main wall that faces the back surface of the chassis with the circuit boards interposed therebetween and a peripheral wall extending from the peripheral edge of the main wall toward the chassis. The peripheral wall is provided with a plurality of air inlets and a plurality of air outlets.

According to the above-mentioned configuration, the circuit boards are arranged concentrically, and these circuit boards are accommodated in the projecting portion of the back cover. Therefore, it is possible to ensure a space facing the edge portion of the back cover in the periphery of the projecting portion of the back cover. Since the projecting portion of the back cover is provided with the air inlets and the air outlets on its peripheral wall, even when the plasma display device is mounted on the wall or placed near the wall so that the main wall of the projecting portion is close to or in contact with the wall surface, it is possible to use the thus ensured space facing the edge portion of the back cover as a path for dissipating the heat of the circuit boards by the fan. Further, the heat from the PDP transferred through the chassis is released into the atmosphere by radiation through the edge portion of the back cover. Thus, the plasma display device of the present invention can emit internal heat sufficiently, even when being mounted on the wall or placed near the wall.

DETAILED DESCRIPTION OF THE INVENTION

Hereinafter, embodiments for carrying out the present invention are described with reference to the drawings. However, the present invention is not limited thereto.

First Embodiment

Figure 1:
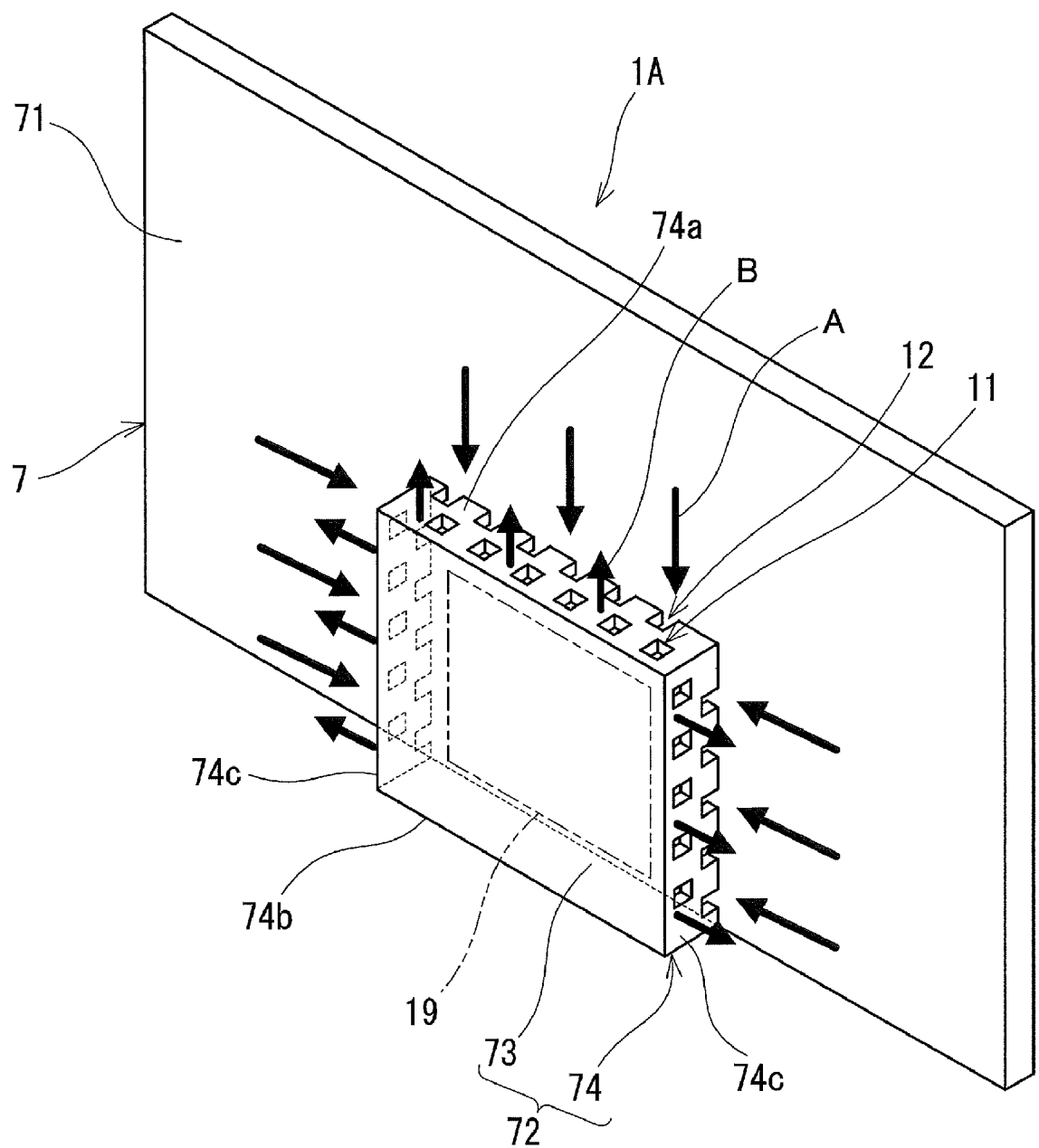
FIG. 1 is a schematic perspective view illustrating a configuration of a plasma display device according to the first embodiment of the present invention.
Figure 2:
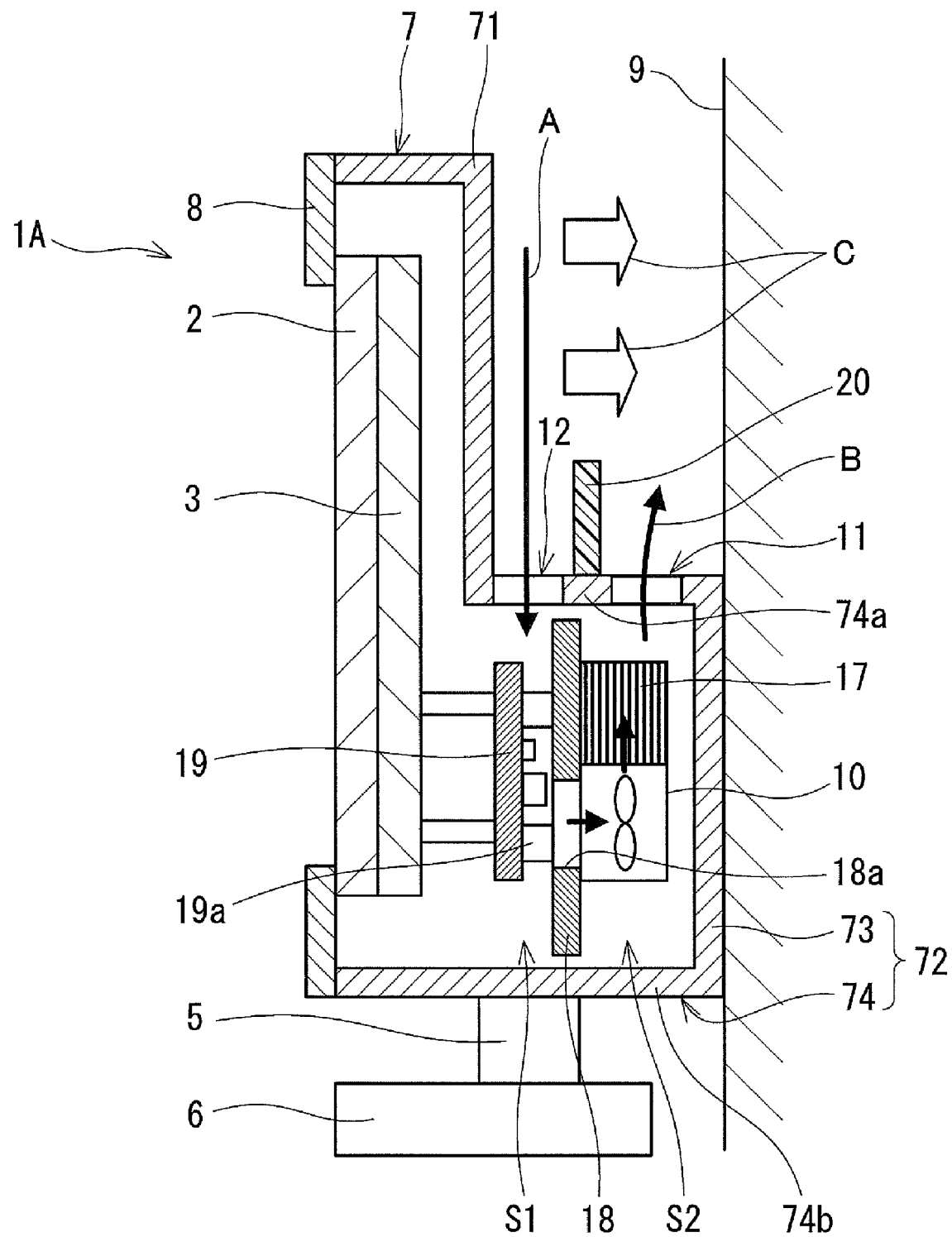
FIG. 2 is a schematic sectional view showing the plasma display device of FIG. 1.

FIG. 1 and FIG. 2 indicate a plasma display device 1A according to the first embodiment of the present invention. The plasma display device 1A is provided with a PDP 2 for displaying images, a chassis 3 supporting the PDP 2 on its front surface, and a plurality of circuit boards 19 for driving the PDP 2 that are arranged on the back side of the chassis 3. It should be noted that the plurality of the circuit boards 19 are illustrated as a single board to simplify the view in FIG. 1. Further, the plasma display device 1A is provided with a front cover 8 and a back cover 7 that constitute a housing. The housing accommodates the PDP 2, the chassis 3 and the circuit boards 19.

The PDP 2 has an elongated shape and is placed in an upright position using a base 6 for installation that has a support portion 5 so that the longitudinal direction coincides with the substantially horizontal direction and the short direction coincides with the substantially vertical direction, in this embodiment. Specifically, the PDP 2 is constituted by a front glass substrate and a back glass substrate bonded to each other, and an electric discharge space is formed between them.

Figure 7:
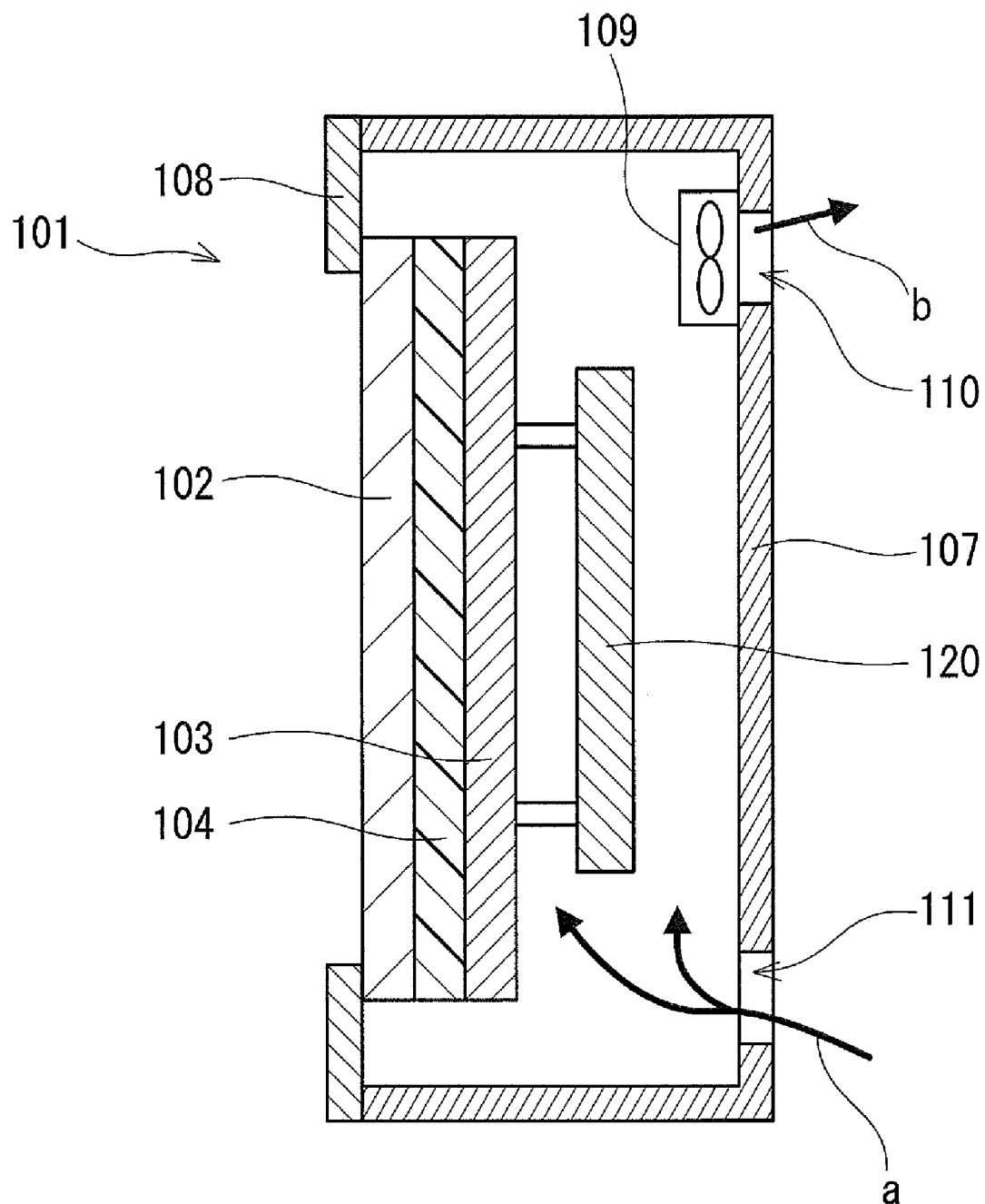
FIG. 7 is a schematic sectional view showing a conventional plasma display device.

The chassis 3 is used not only as a support member but also as a heat radiation plate, and is made of a metal such as aluminum taking into consideration the heat radiation performance. It also is possible to interpose the heat conductive sheet 104 between the PDP 2 and the chassis 3, as with the conventional plasma display device 101 indicated in FIG. 7.

The circuit boards 19 are arranged closely and concentrically to be located within a specific region of the back surface of the chassis 3. In this embodiment, the specific region of the back surface of the chassis 3 is the lower center portion of the back surface of the chassis 3, as indicated in FIG. 1. As indicated in FIG. 2, a plurality of electronic components 19a are mounted on one surface of the circuit boards 19, and the circuit boards 19 are arranged in parallel to the back surface of the chassis 3 in such a manner that the above-mentioned surface faces opposite the chassis 3. The circuit boards 19 are mounted to the back surface of the chassis 3 via bosses.

The front cover 8 is a frame having a rectangular shape, as viewed from the front, and covers the peripheral edge portion of the front surface of the PDP 2. The front cover 8 is made, for example, of a resin. On the other hand, the back cover 7 has a shape such that the back cover 7 encloses the PDP 2 and the chassis 3 over the circuit boards 19. The back cover 7 can be made, for example, of metals such as a metal with a highly radioactive ceramic sheet bonded on the front and back sides thereof, a metal subjected to a black or other alumite treatment, and a metal to which carbon black is applied. Alloys mainly containing aluminum or iron can be used as these metals.

Specifically, the back cover 7 includes an edge portion 71 that covers the outside of the specific region of the back surface of the chassis 3, and a projecting portion 72 that projects inside the edge portion 71 toward the side opposite to the chassis 3 and accommodates the circuit boards 19.

In this embodiment, since the specific region is the lower center portion of the back surface of the chassis 3, the edge portion 71 that covers the outside thereof has a downwardly opening U shape, as viewed from the back. However, the shape of the edge portion 71 is not limited thereto. The specific region that defines the region where the circuit boards 19 are present may be the center portion of the back surface of the chassis 3, and corresponding to it, the edge portion 71 that covers the outside of the specific region has a rectangular frame shape as viewed from the back, for example.

The projecting portion 72 includes a main wall 73 that faces the back surface of the chassis 3 with the circuit boards 19 interposed therebetween, and a peripheral wall 74 that extends from the peripheral edge of the main wall 73 toward the chassis 3 and that connects the peripheral edge of the main wall 73 to the inner edge of the edge portion 71. The peripheral wall 74 has a laterally elongated rectangular tubular shape, and includes an upper side portion 74a that constitutes the upper surface of the projecting portion 72, a lower side portion 74b that constitutes the lower surface of the projecting portion 72, and a pair of side portions 74c that constitute the left and right side surfaces of the projecting portion 72.

Furthermore, in this embodiment, a plurality of air inlets 12 for taking in external air and a plurality of air outlets 11 for emitting the internal air to the outside are provided in each of the upper side portion 74a and the pair of the side portions 74c of the peripheral wall 74, as a configuration for ventilating the inside of the projecting portion 72. Further, a fan 10 is provided inside the space defined by the projecting portion 72.

Inside the space defined by the projecting portion 72, a partition plate 18 that partitions such space into a front space S1 on the chassis side and a back space S2 on the main wall 73 side is provided. The air inlets 12 are provided in the forward position of each of the upper side portion 74a and the pair of the side portions 74c so as to open into the front space S1. The air outlets 11 are provided in the backward position of each of the upper side portion 74a and the pair of the side portions 74c so as to open into the back space S2.

Each of the air inlets 12 and the air outlets 11 is a group of fine through holes that are aligned on a plurality of straight lines in practice. However, to simplify the view, those through holes are illustrated as a single opening in FIG. 1. Each through hole has a size of about several mm that is too small for the users to insert their fingers in order to reduce the chance of the contact from the outside with the inside of the device that has a high temperature. Thus, burn injuries or the like can be avoided. Further, the through hole may be rectangular, circular, or elliptical in shape.

In this embodiment, the air inlets 12 and the air outlets 11 are arranged in staggered rows in the circumferential direction of the peripheral wall 74. In order to prevent the air emitted through the air outlets 11 from being taken into the projecting portion 72 again through the air inlets 12, the air inlets 12 and the air outlets 11 preferably are spaced apart from each other in the circumferential direction of the peripheral wall 74. In other words, it is preferable that the air inlets 12 and the air outlets 11 each be arranged at a position not overlapping with the other in the thickness direction of the chassis 3.

The partition plate 18 is a heat diffusing plate arranged in parallel to the circuit boards 19 so as to be in contact with the electronic components 19a mounted on the circuit boards 19. That is, the circuit boards 19 are located inside the front space S1. A communication hole 18a that communicates between the front space S1 and the back space S2 is provided in the partition plate 18, and the fan 10 is mounted on the back surface of the partition plate 18 so as to cover the communication hole 18a.

In this embodiment, a centrifugal fan is employed as the fan 10, and the fan 10 is oriented so that the air drawn from the front space S1 through the communication hole 18a can be discharged upwardly and laterally. A heatsink 17 is mounted on the back surface of the partition plate 18 above the fan 10, so that the air discharged upwardly through the fan 10 can flow between the fins of the heatsink 17.

Furthermore, in order to prevent the air discharged through the air outlets 11 from being taken into the projecting portion 72 again through the air inlets 12, a guide plate 20 that extends between the flow path of the air to be drawn through the air inlets 12 and the flow path of the air to be emitted through the air outlets 11 is provided on each of the upper side portion 74a and the pair of the side portions 74c of the peripheral wall 74, in this embodiment. It should be noted that the guide plate 20 is omitted in FIG. 1, which illustrates the positional relationship between the air inlets 12 and the air outlets 11. The guide plate 20 is an elongated plastic plate with a height of about several mm, and is fixed to the peripheral wall 74, for example, by welding.

Next, the heat dissipation in the plasma display device 1A according to this embodiment is described.

The heat generated in the PDP 2 is released from the front surface of the PDP 2 into the atmosphere by radiation and the like, while being transferred from the back surface of the PDP 2 to the chassis 3. The heat transferred to the chassis 3 is released into the atmosphere through the edge portion 71 of the back cover 7 by radiation, as indicated by the arrow C in FIG. 2.

On the other hand, the circuit boards 19 inside the projecting portion 72 are cooled by forced convection. That is, when the fan 10 is operated, external air is drawn into the projecting portion 72 (in the front space S1) through the air inlets 12, as indicated by the arrow A in FIG. 2, while the air inside the projecting portion 72 (in the back space S2) is emitted to the outside through the air outlets 12, as indicated by the arrow B in FIG. 2. Thus, the heat from the circuit boards 19 can be emitted to the outside.

More specifically, concerning the heat dissipation of the circuit boards 19, the heat generated in the electronic components 19a mounted on the circuit boards 19 is transferred to the heatsink 17 through the partition plate 18 that is a heat diffusing plate, and further transferred to the air flowing between the fins of the heatsink 17 by the fan 10. Furthermore, the heat transferred to the partition plate 18 is released into the atmosphere through the main wall 73 of the projecting portion 72 also by radiation. On the other hand, the heat that has not been transferred to the partition plate 18 is transferred to the air flowing into the front space S1 through the air inlets 12.

As can be seen from the above, in the plasma display device 1A according to this embodiment, since the circuit boards 19 are arranged concentrically and accommodated in the projecting portion 72 of the back cover 7, a space that faces the edge portion 71 of the back cover 7 can be ensured at the periphery of the projecting portion 72 of the back cover 7. Further, since the projecting portion 72 of the back cover 7 is provided with the air inlets 12 and the air outlets 11 on the peripheral wall 74, even when the plasma display device 1A is mounted on the wall or placed near the wall so that the main wall 73 of the projecting portion 72 is close to or in contact with the wall surface 9, it is possible to use the thus ensured space that faces the edge portion 71 of the back cover 7 as a path for dissipating the heat in the circuit boards 19 by the fan 10. Further, the heat from the PDP 2 dissipated through the chassis 3 is released into the atmosphere by radiation through the edge portion 71 of the back cover 7.

Thus, the plasma display device 1A of the present embodiment can emit internal heat sufficiently, even when being mounted on the wall or placed near the wall. Moreover, the peripheral edge of the back cover 7 has a reduced thickness, and therefore the device that appears thin can be achieved.

Further, since the air inlets 12 open into the front space S1 in front of the partition plate 18 and the air outlets 11 open into the back space S2 behind the partition plate 18 in this embodiment, the air at comparatively low temperature to be drawn through the air inlets 12 flows along the edge portion 71 of the back cover 7. Accordingly, heat is dissipated from the edge portion 71 not only by radiation but also by heat transfer, so that the heat dissipation effect of the PDP 2 can be enhanced further. Particularly in this embodiment, since the air inlets 12 and the air outlets 11 are provided in the upper side portion 74a and the pair of the side portions 74c of the peripheral wall 74, heat can be dissipated over a wide area in the edge portion 71 by heat transfer.

Furthermore, the guide plate 20 is provided so as to be located between the air inlets 12 and the air outlets 11 of the peripheral wall 74 in this embodiment, which can prevent the formation of the circulation flow from the air outlets 11 toward the air inlets 12. This enhances the heat dissipation performance and improves the cooling effect on the circuit boards 19.

Modified Embodiment

Although the air inlets 12 and the air outlets 11 are provided in the upper side portion 74a and the pair of the side portions 74c of the peripheral wall 74 in the above-described embodiment, the arrangement of the air inlets 12 and the air outlets 11 is not limited thereto. For example, a configuration in which only the air inlets 12 are provided in the pair of the side portions 74c, and only the air outlets 11 are provided in the upper side portion 74a also is possible.

Alternatively, in the case where the partition plate 18 is not provided inside the projecting portion 72, it also is possible to employ a configuration in which the air inlets 12 are provided in the lower side portion 74b and the air outlets 11 are provided in the upper side portion 74a.

Further, although the circuit boards 19 are located inside the front space S1 in the above-described embodiment, the circuit boards 19 may be located inside the back space S2.

Furthermore, the communication hole 18a is not necessarily provided in the partition plate 18, and a gap that communicates between the front space S1 and the back space S2 may be formed between the lower end portion of the partition plate 18 and the lower side portion 74b of the peripheral wall 74 of the projecting portion 72, for example. In that case, it also is possible to provide an axial fan in the gap.

Second Embodiment

Figure 3:
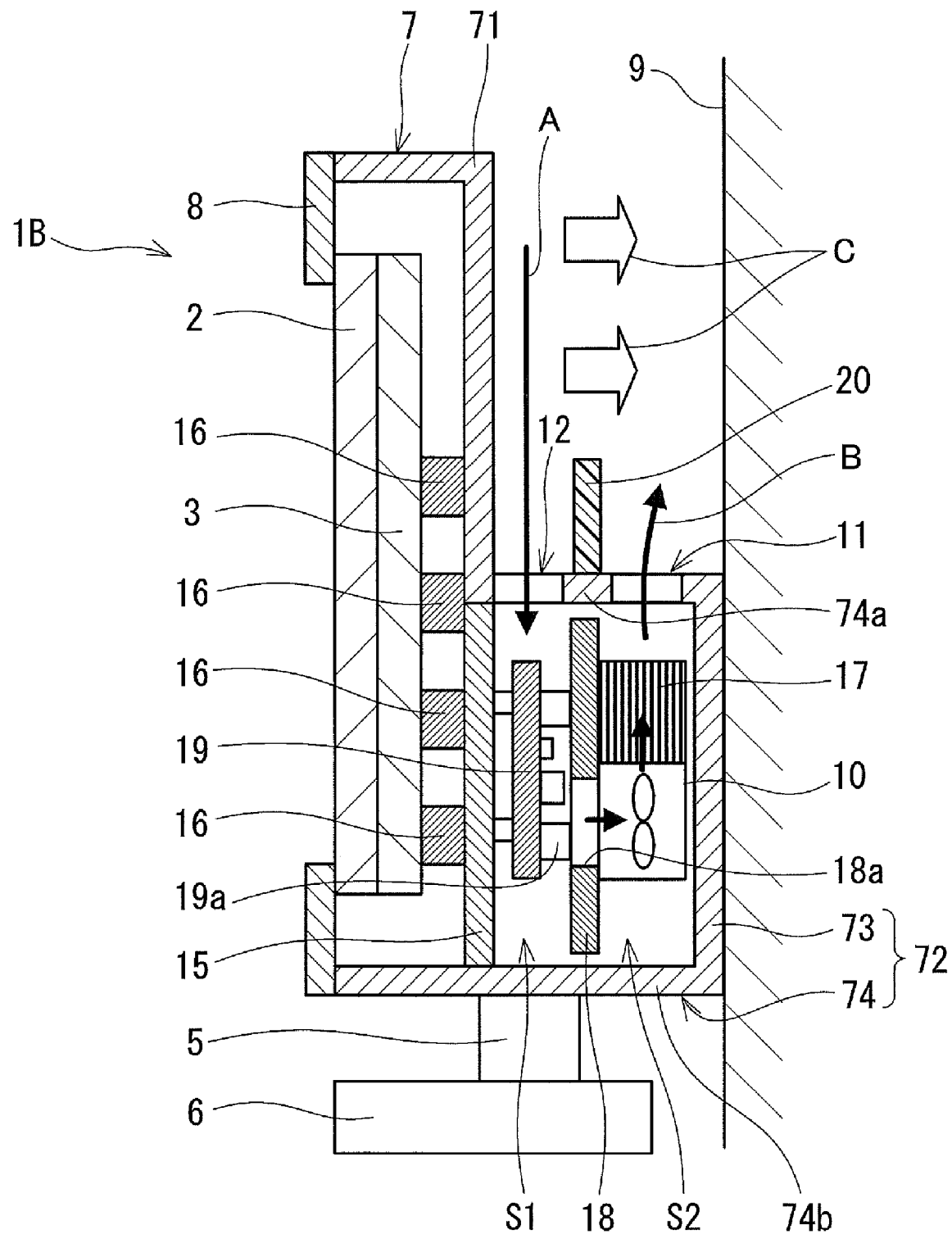
FIG. 3 is a schematic sectional view showing a configuration of a plasma display device according to the second embodiment of the present invention.
Figure 4:
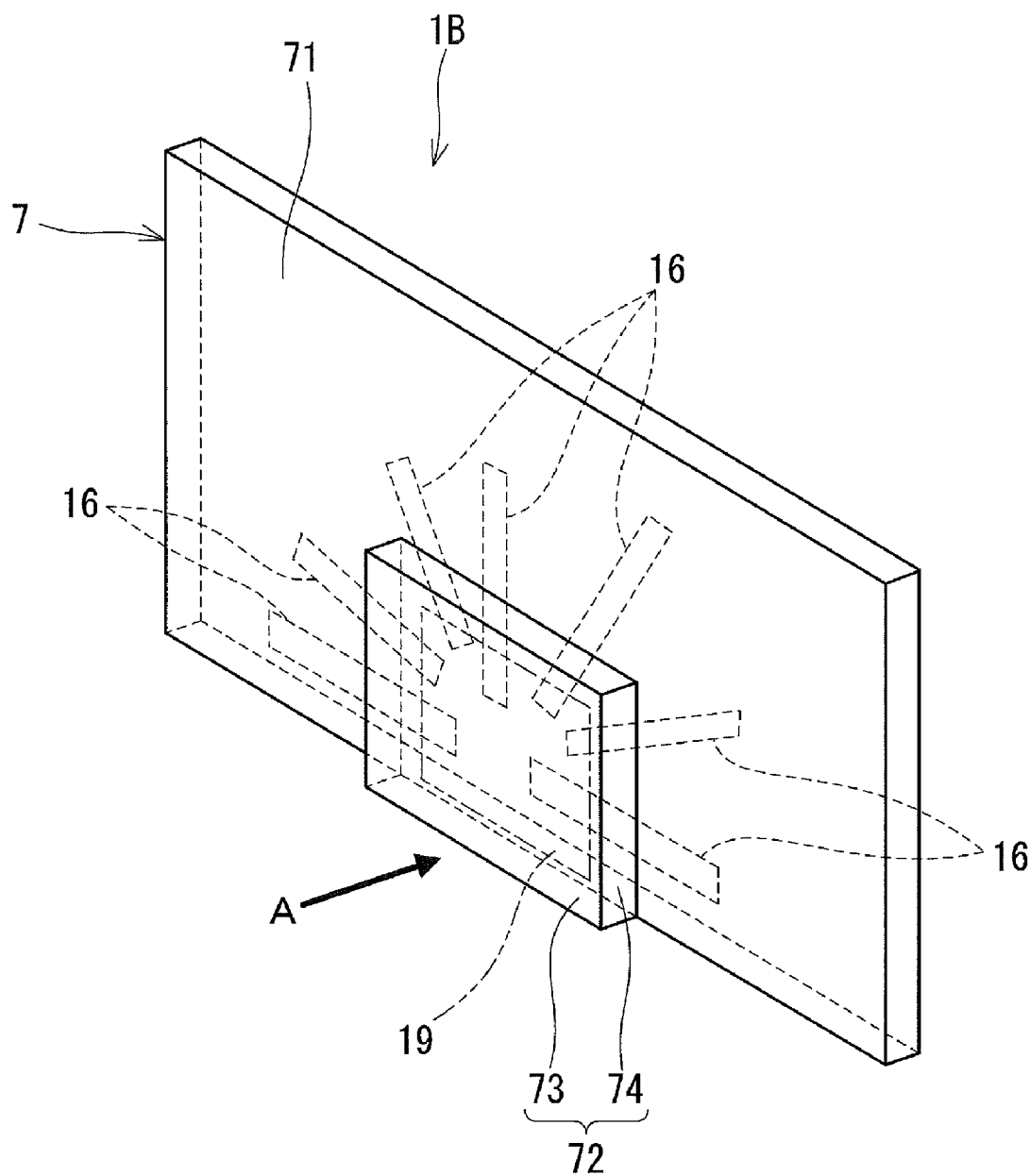
FIG. 4 is a schematic perspective view illustrating the plasma display device of FIG. 3.

FIG. 3 and FIG. 4 indicate a plasma display device 1B according to the second embodiment of the present invention. It should be noted that the same parts as in the first embodiment may be indicated with identical reference numerals and the descriptions thereof are omitted in this embodiment. Further, in order to make it easy to understand the features of the second embodiment, the illustrations of the air inlets 12 and the air outlets 11 are omitted in FIG. 4. However, the configurations of the air inlets 12 and the air outlets 11 that have been described in the first embodiment and its modified embodiment also can be applied to this embodiment.

In this embodiment, a separation wall 15 that separates the space interposed between the chassis 3 and the circuit boards 19 into the space on the chassis 3 side and the space on the circuit boards 19 side is provided. The circuit boards 19 are mounted to the separation wall 15 via bosses.

It is preferable that the separation wall 15 be provided continuously with the edge portion 71 of the back cover 7. Further, the separation wall 15 preferably is provided so as to close the space defined by the projecting portion 72 from the chassis 3 side. The separation wall 15 is provided appropriately with cutouts through which cables for connecting the PDP 2 and the circuit boards 19 are inserted, though the illustration thereof is omitted.

Figure 5:
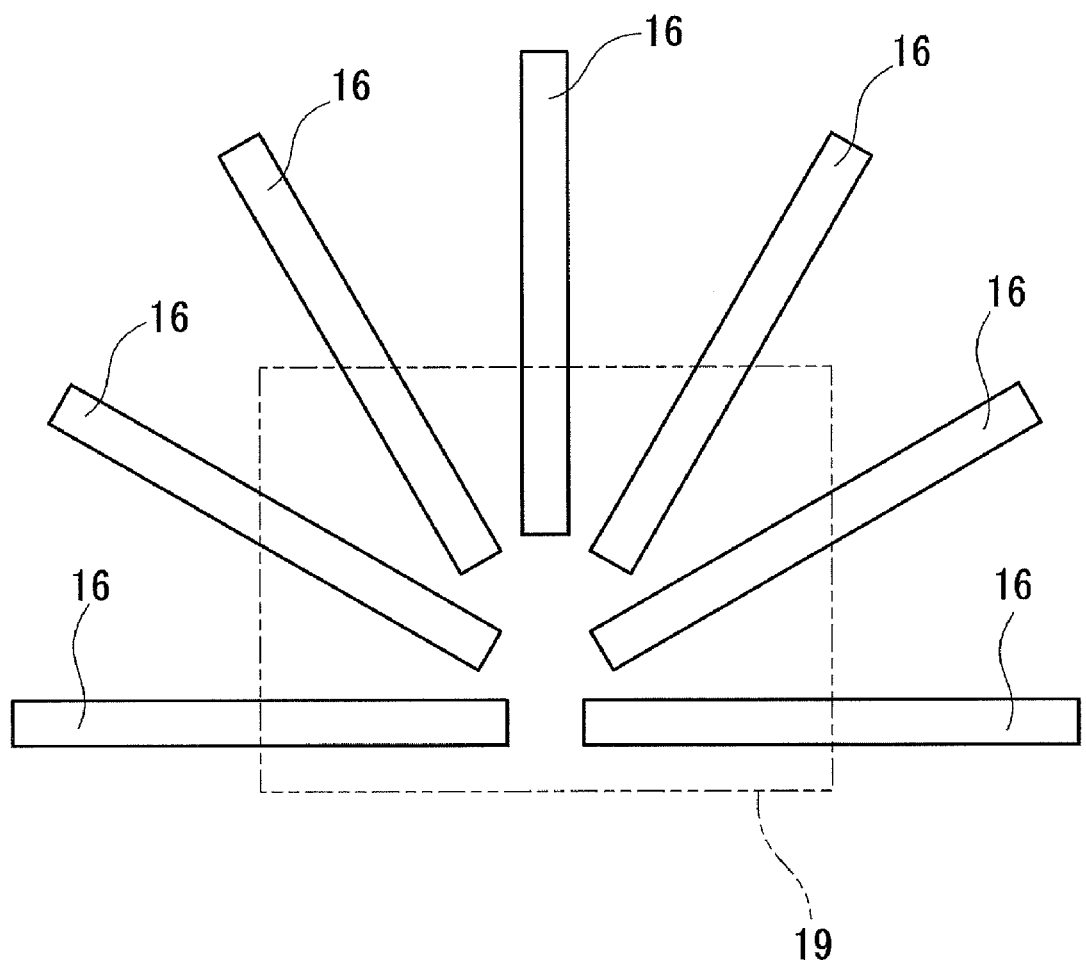
FIG. 5 shows a layout of the arrangement of heat pipes.

Furthermore, a configuration for positively releasing the heat transferred from the circuit boards 19 to the above-mentioned separation wall 15 into the edge portion 71 of the back cover 7 is employed in this embodiment. Specifically, a plurality of heat pipes 16 are provided to serve as a heat transfer member, extending across from the front surface of the separation wall 15 that faces the chassis 3 to the inner wall of the edge portion 71 of the back cover 7 that faces the chassis 3. The heat pipes 16 are in contact also with the back surface of the chassis 3. More specifically, the heat pipes 16 are arranged in a radial pattern that spreads out from the separation wall 15, with the portion where the circuit boards 19 and the separation wall 15 overlap at the center, as indicated in FIG. 5.

Each heat pipe 16 has a configuration in which a small amount of a working fluid is enclosed in a closed container made of a metal such as copper under vacuum and a capillary structure is formed on the internal surface of the closed container. As a working fluid, water can be used, for example. When a part of the heat pipes 16 is heated, the working fluid evaporates in the heated portion. Then, the vapor flows into a low-temperature portion, and the vapor is condensed in the low-temperature portion. The condensed liquid flows back to the heated portion due to the capillary phenomenon. This sequence of phase changes occurs continuously to cause rapid heat transfer. The heat pipes 16 are a heat transfer device that uses the rapid heat transfer. The heat pipes 16 each preferably are arranged so that one end thereof overlaps the circuit boards 19 in the forward and backward direction of the plasma display device (the thickness direction of the chassis 3).

Next, the heat dissipation in the plasma display device 1B according to this embodiment is described.

The heat dissipation by radiation from the edge portion 71 of the back cover 7, which is indicated by the arrow C in FIG. 3, and the cooling of the circuit boards 19 due to forced convection by the fan 10 through the air inlets 12 and the air outlets 11, which is indicated by the arrows A and B in FIG. 3, are as described in the first embodiment.

More specifically, concerning the heat dissipation of the circuit boards 19, the heat generated in the electronic components 19a mounted on the circuit boards 19 is transferred to the heatsink 17 through the partition plate 18 that is a heat diffusing plate, and further transferred to the air flowing between the fins of the heatsink 17 by the fan 10. Furthermore, the heat transferred to the partition plate 18 is released into the atmosphere through the main wall 73 of the projecting portion 72 also by radiation.

On the other hand, the heat that has not been transferred to the partition plate 18 is transferred from the entire circuit boards 19 (particularly from the other surface on the opposite side to the surface on which the electronic components 19a are mounted) to the projecting portion 72 and the separation wall 15 by radiation or convection inside the projecting portion 72. The heat transferred to the projecting portion 72 is released into the atmosphere directly.

As seen from above, in the plasma display device 1B according to this embodiment, the separation wall 15 is arranged between the circuit boards 19 that are arranged concentrically and the chassis 3, which provides the heat shielding therebetween. This can prevent the heat concentration on the portion sandwiched between the circuit boards 19 and the chassis 3 and enables the heat from the circuit boards 19 to be emitted effectively to the outside due to forced convection by the fan 10. Further, the heat from the PDP 2 dissipated through the chassis 3 can be released into the atmosphere by radiation through the edge portion 71 of the back cover 7. Thus, according to the present embodiment, the plasma display device 1B can emit internal heat sufficiently, while reducing its visual thickness.

Furthermore, since the separation wall 15 and the edge portion 71 of the back cover 7 are connected thermally by the heat pipes 16 in this embodiment, it is possible to release the heat transferred to the separation wall 15 from the circuit boards 19 into the edge portion 71. This enables the separation wall 15 to be cooled effectively, which makes it possible to obviate the problems, such as unstable operation and short life span of the circuit boards 19 to be caused by heat.

Having the heat pipes 16 inclined to some extent relative to the horizontal direction increases the heat transfer effect. Therefore, when the heat pipes 16 are arranged in a radial pattern, as in this embodiment, it is possible to transfer the heat in the portion sandwiched by the circuit boards 19 and the chassis 3 more positively to the low-temperature portion of the peripheral edge. Thus, the heat dissipation efficiency can be improved further.

Modified Embodiment

It should be noted that although the heat pipes 16 are in contact also with the back surface of the chassis 3 in the embodiment, they may be spaced apart therefrom. However, even if the separation wall 15 is provided, the temperature of the portion facing the circuit boards 19 in the chassis 3 tends to be high. Therefore, it is preferable that the heat pipes 16 be in contact with the back surface of the chassis 3 as is the case of the above-mentioned embodiment. Such a configuration allows the heat pipes 16 to release the heat efficiently to the edge portion 71 of the back cover 7 from the portion in the chassis 3 where the temperature tends to be high, thus suppressing the increase in temperature of the portion in the chassis 3 where temperature tends to be high.

Figure 6:
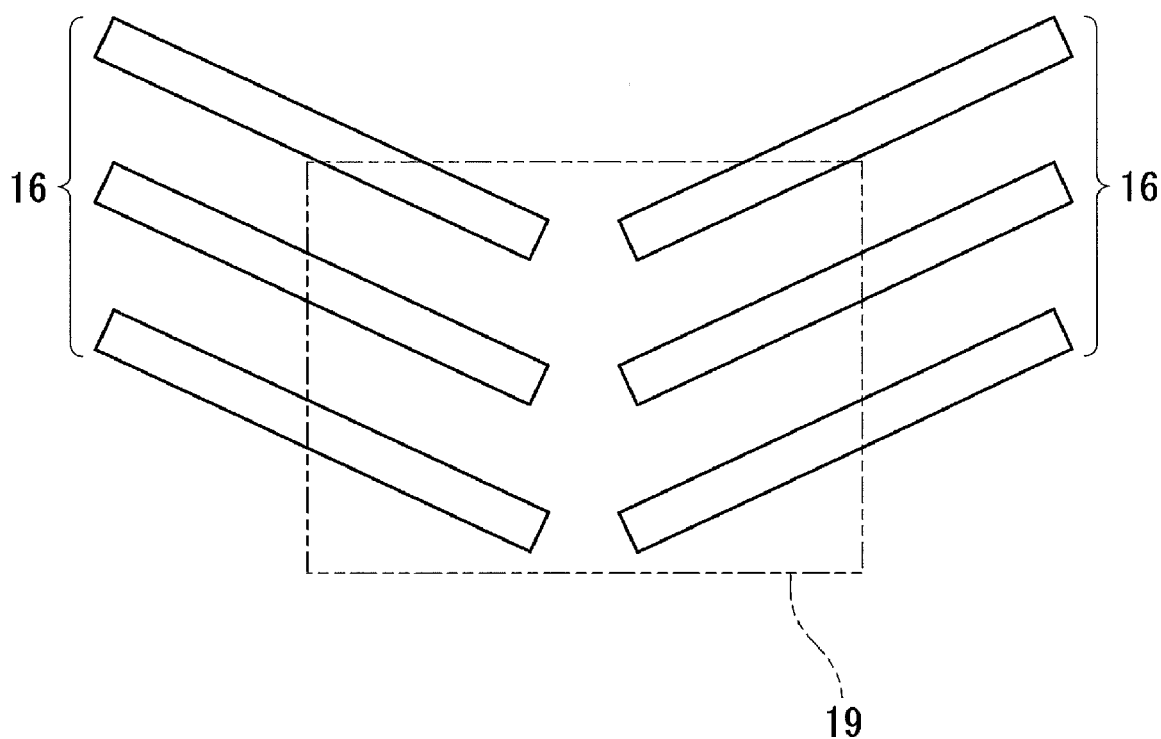
FIG. 6 shows a layout of the arrangement of heat pipes in a modified embodiment.

Further, the heat pipes 16 are not necessarily arranged in a radial pattern that spreads out from the separation wall 15, and may be arranged so that identical V shapes are formed in multiple steps, for example as indicated in FIG. 6.

Furthermore, although a plurality of the heat pipes 16 are used as a heat transfer member in the above-described embodiment, a single heat transfer plate spreading out from the separation wall 15 in a fan-shaped pattern also can be used as a heat transfer member, for example.

The present invention is effective in reducing the temperature, when circuit boards are arranged concentrically for achieving a further reduction in the thickness of a plasma display device.

The present invention may be embodied in other forms without departing from the spirit or essential characteristics thereof. The embodiments described in this specification are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A plasma display device comprising:
   a plasma display panel;
   a chassis supporting the plasma display panel on its front surface;
   circuit boards located within a specific region of a back surface of the chassis;
   a back cover including an edge portion that covers the outside of the specific region of the back surface of the chassis, and a projecting portion that projects inside the edge portion toward the side opposite to the chassis and that accommodates the circuit boards;
   a fan arranged inside a space defined by the projecting portion; and
   a partition plate provided in the space defined by the projecting portion, the partition plate partitioning the space into a front space on the chassis side and a back space on the main wall side, wherein
   the projecting portion includes a main wall, which has a peripheral edge, that faces the back surface of the chassis with the plurality of the circuit boards interposed therebetween, and a peripheral wall that extends from the peripheral edge of the main wall toward the chassis, the peripheral wall is provided with a plurality of air inlets and a plurality of air outlets, the plurality of the air inlets open into the front space, the plurality of the air outlets open into the back space, and the partition plate is a heat diffusing plate arranged so as to be in contact with electronic components mounted on the plurality of the circuit boards.

2. The plasma display device according to claim 1, wherein the partition plate is provided with a communication hole communicating between the front space and the back space, and the fan is mounted to the partition plate so as to cover the communication hole.

3. The plasma display device according to claim 1, wherein the plasma display panel is in an upright position, the peripheral wall includes an upper side portion that constitutes an upper surface of the projecting portion, a lower side portion that constitutes a lower surface of the projecting portion, and a pair of side portions that constitute left and right side surfaces of the projecting portion, and the plurality of the air inlets and the plurality of the air outlets are provided in each of the upper side portion and the pair of side portions.

4. The plasma display device according to claim 1, wherein the air inlets and the air outlets are arranged in staggered rows in a circumferential direction of the peripheral wall and are spaced apart from each other in the circumferential direction of the peripheral wall.

5. The plasma display device according to claim 1, further comprising:

a guide plate provided on the peripheral wall, the guide plate separating between the flow path of the air to be drawn through the plurality of the air inlets and the flow path of the air to be emitted through the plurality of the air outlets.

6. The plasma display device according to claim 1, wherein the plurality of the circuit boards are located inside the front space.

7. The plasma display device according to claim 1, further comprising:

a separation wall separating a space interposed between the chassis and the plurality of the circuit boards into a space on the chassis side and a space on the plurality of the circuit boards side.

8. The plasma display device according to claim 7, further comprising:

a heat transfer member provided extending across from a front surface of the separation wall that faces the chassis to an inner wall of the edge portion of the back cover that faces the chassis.

9. The plasma display device according to claim 8, wherein the heat transfer member is in contact also with the back surface of the chassis.

10. The plasma display device according to claim 8, wherein the heat transfer member is a plurality of heat pipes each constituted by a closed container enclosing a working fluid.

11. The plasma display device according to claim 10, wherein the plurality of the heat pipes are arranged in a radial pattern that spreads out from the separation wall.

* * * * *